US005573680A

United States Patent [19]
Shaw et al.

[11] Patent Number: 5,573,680
[45] Date of Patent: Nov. 12, 1996

[54] METHOD FOR ETCHING A SEMICONDUCTOR MATERIAL WITHOUT ALTERING FLOW PATTERN DEFECT DISTRIBUTION

[75] Inventors: Roger W. Shaw, Kirkwood; Joseph C. Holzer, Manchester, both of Mo.

[73] Assignee: MEMC Electronic Materials, Inc., St. Peters, Mo.

[21] Appl. No.: 283,782

[22] Filed: Aug. 1, 1994

[51] Int. Cl.⁶ .................................................. H01L 21/02
[52] U.S. Cl. .................... 216/85; 156/625.1; 156/626.1; 216/83; 216/84; 216/99
[58] Field of Search ............................ 156/626.1, 625.1; 216/84, 85, 99, 83

[56] References Cited

U.S. PATENT DOCUMENTS

| | | | |
|---|---|---|---|
| 2,275,194 | 3/1942 | Sizelove | 204/284 |
| 3,143,447 | 8/1964 | Norr | 156/626.1 |
| 3,408,270 | 10/1968 | Gentile | 204/153.1 |
| 3,615,958 | 10/1971 | Cohen | 216/99 |
| 3,629,023 | 12/1971 | Strehlow | 156/643.1 |
| 3,677,848 | 7/1972 | Stoller et al. | 156/626.1 |
| 3,923,567 | 12/1975 | Lawrence | 156/626.1 |
| 4,100,014 | 7/1978 | Kuhn-Kuhnenfeld et al. | 156/647.1 |
| 4,238,275 | 12/1980 | Shih | 156/626.1 |
| 4,316,765 | 2/1982 | Thiel | 156/626.1 |
| 4,396,459 | 8/1983 | Herning et al. | 156/626.1 |

*Primary Examiner*—T. Tung
*Attorney, Agent, or Firm*—Senniger, Powers, Leavitt & Roedel

[57] ABSTRACT

A method of etching a generally planar surface of a semiconductor material to reveal flow pattern defects on the surface, by placing the material in a canted position, ranging from about 5° to about 35° from vertical, such that the generally planar surface of the material faces upwardly. The material is then immersed into a stagnant etchant solution. The surface of the material is etched such that bubbles nucleating at flow pattern defects on the surface of the canted material are released directly into the otherwise stagnant etchant solution.

6 Claims, 3 Drawing Sheets

METHOD FOR ETCHING A SEMICONDUCTOR MATERIAL WITHOUT ALTERING FLOW PATTERN DEFECT DISTRIBUTION

BACKGROUND OF THE INVENTION

The present invention relates generally to an apparatus and method for etching a surface of a semiconductor material without disturbing the flow pattern defect distribution on the surface. More particularly, the invention relates to an apparatus and method which enable accurate determination of flow pattern defects at any position on the surface of a semiconductor material.

When a silicon crystal is grown, vacancies are formed where a silicon atom is missing from the crystal matrix. These vacancies are believed to coalesce at certain temperatures forming defects throughout the single crystal. The grown-in defects resulting from a collection of vacancies include flow pattern defects (FPDs) also known as D defects. These defects adversely affect properties of devices formed from the silicon wafers, such as gate oxide integrity.

Flow pattern defects on the surface of a silicon wafer are not detectable until the wafer has been subjected to an etching process. Silicon wafers are typically placed within an etch basket that is immersed in a tank filled with a Secco etching solution. The front and back surfaces of each of the wafers are positioned vertically within the etch tank. As the etching occurs, the chemical reaction nucleates a bubble at each defect on the front wafer surface (i.e., the surface of the wafer which is to be analyzed). The bubble grows as reaction products are formed and eventually breaks away from the defect site and floats upwardly along the surface of the wafer. This causes a V-shaped pattern to form on the surface as the bubble grows and travels upwardly. The tip of the V-shaped pattern marks the location of the defect on the surface. The V-shaped flow patterns can be identified under magnification and provide a quantitative measurement of the flow pattern defect density within the semiconductor material.

When the flow patterns are analyzed, the density of V-shaped patterns significantly and continuously decreases from the lower half of the wafer to the top half of the wafer (i.e., from point 5 to point 1 as shown in FIG. 5). This variation in defect density across the front wafer surface is recognized as an artifact of the etching process but the cause of the variation is unknown. Recognizing this problem, the current practice is to average the number of defects found at a plurality of locations on the wafer surface to estimate an approximate flow pattern defect density.

As a result of the present invention, it is now believed that the density variation is caused by interferences on the front surface of a silicon wafer during the etching process. As a bubble moves upwardly along the wafer surface, it can interfere with the bubbles which are being formed on the surface above it and can dislodge these bubbles before they have caused the characteristic flow pattern to form. These disturbances generally result in a lower flow pattern density for points uppermost on the front surface of the wafer. The flow patterns formed during etching are therefore dictated by the etching process rather than the actual defect distribution on the wafer surface. Additionally, as the bubbles at the bottom of a wafer surface travel upward, the etchant at the surface is carried upward by the bubbles, resulting in non-uniform removal of silicon from the wafer surface.

Integrated circuit manufacturers are beginning to require silicon wafers having less than 100 flow pattern defects per square centimeter. As more stringent defect standards are required by the industry, the accuracy of defect detection must improve. There is a need for an etching process which facilitates accurate determination of flow pattern defects at any point on the front surface of a silicon wafer and therefore a more accurate determination of the bulk density of grown-in defects. The crystal growth process can then be modified to minimize grown-in defects in subsequent silicon single crystals.

SUMMARY OF THE INVENTION

It is a primary object of the present invention to provide an apparatus and an etching process which improve the quantitative measurement of flow pattern defects on the surface of a semiconductor material so that the crystal growth process can be improved by minimizing these defects in subsequently grown crystals.

It is another object of this invention to provide an etching process having improved reproducibility of flow pattern formation and etch removal uniformity.

Other objects and advantages of the invention will be apparent from the following detailed description.

In accordance with the present invention the foregoing objectives are realized by providing a method of etching a generally planar surface of a semiconductor material to reveal defects on the surface. The semiconductor material is first placed in a canted position, ranging from about 5° to about 35° from vertical, such that the generally planar surface of the material faces upwardly. The material is then immersed into a stagnant etchant solution. The surface of the material is etched such that bubbles nucleating at defects on the surface of the canted material are released directly into the otherwise stagnant etchant solution.

The present invention is also directed to a receptacle for holding a plurality of semiconductor articles when the articles are immersed in an etchant solution. The receptacle includes a body defining an article receiving compartment and a plurality of article supports for holding the articles within the compartment. Each of the articles has a surface to be etched. The body and supports are configured such that, when the articles are held by the supports and immersed in the etchant solution, the surface of each of the articles faces upwardly in a canted position ranging from about 5° to about 35° from vertical.

Figure 1:
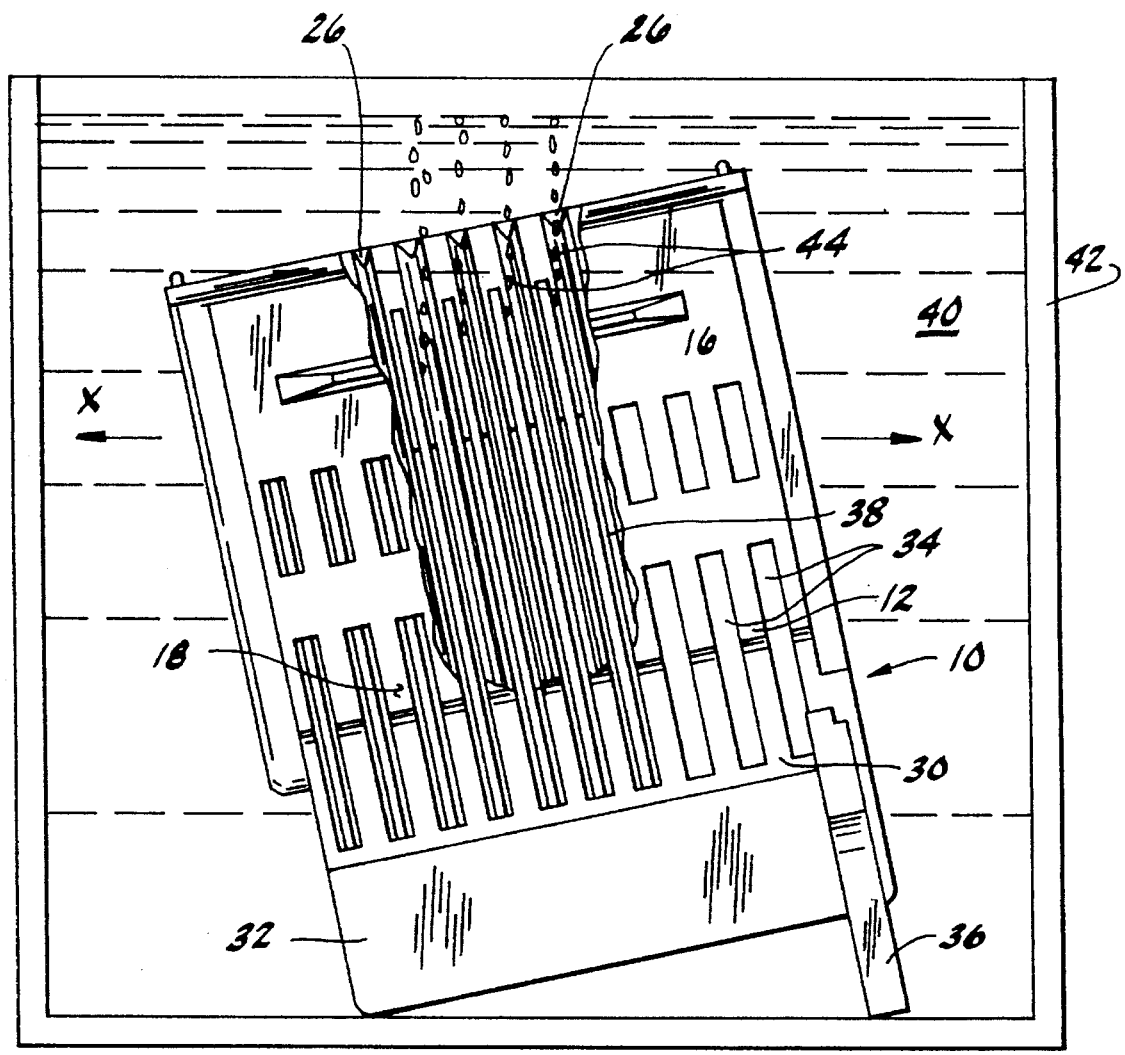
FIG. 1 is a vertical section of a receptacle of the present invention.

While the invention is susceptible to various modifications and alternative forms, specific embodiments thereof have been shown by way of example in the drawings and will herein be described in detail. It should be understood, however, that it is not intended to limit the invention to the particular form disclosed, but on the contrary, the intention is to cover all modifications, equivalents and alternatives falling within the spirit and scope of the invention as defined by the appended claims.

DETAILED DESCRIPTION OF THE PREFERRED EMBODIMENTS

Figure 4:
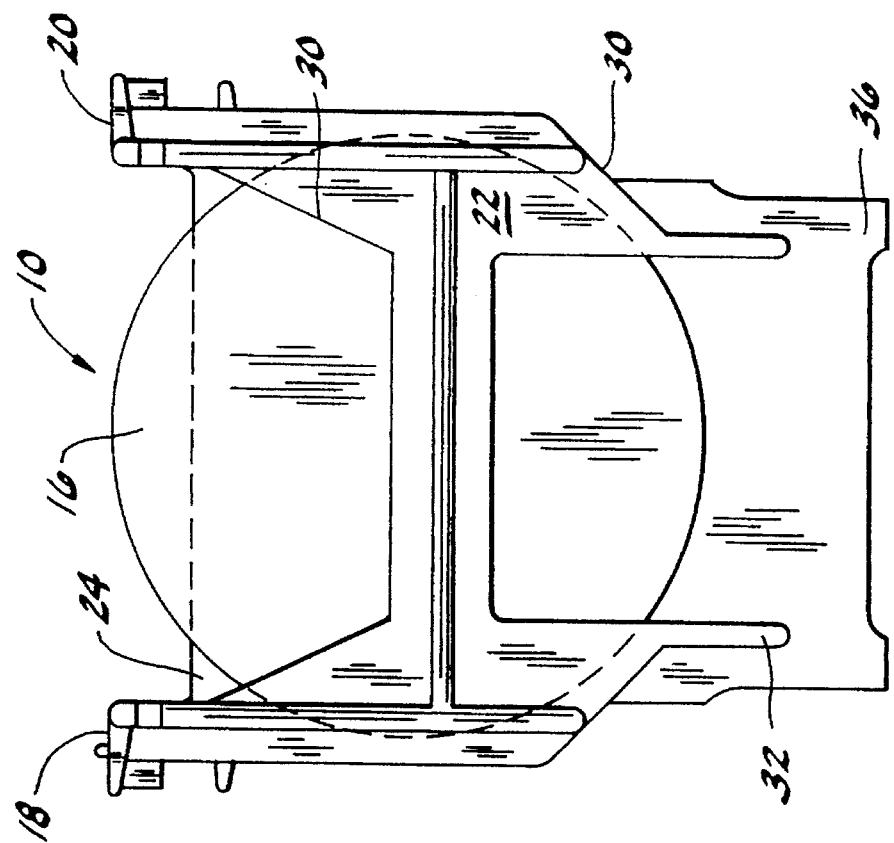
FIG. 4 is a front elevational view of the receptacle.
Figure 3:
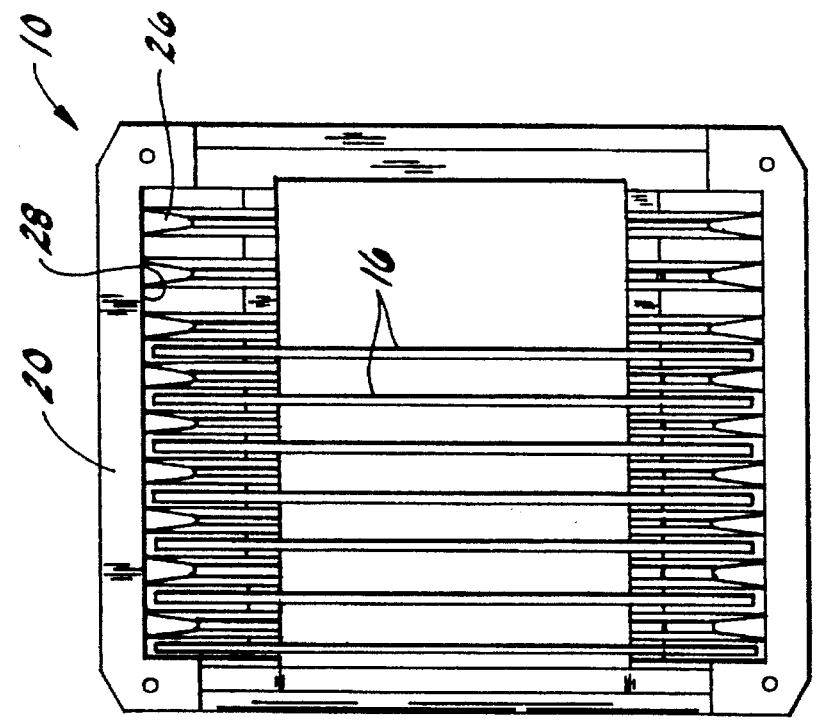
FIG. 3 is a horizontal section taken along the line X—X in FIG. 1 illustrating silicon wafers held by supports within the wafer receiving compartment of the receptacle.

Turning now to FIG. 1 there is shown a receptacle 10 commonly known as an etch basket, having a body 12 forming a compartment 14 for holding semiconductor material 16, such as a silicon wafer, while its surfaces are being etched. The compartment is composed of opposing side walls 18 and 20, a front wall 22 (FIG. 4), and a back wall 24 (FIG. 4). The side walls 18 and 20 have a plurality of adjacent ribs 26 spaced such that they are parallel along the inner surface 28 of each side wall as shown in FIG. 3.

The ribs 26 extend from the top of each side wall and curve inwardly to form a support 30 (FIG. 4) along the bottom of each side wall. The support 30 forms the bottom of the compartment 14, joining each of the side walls to a base 32. A silicon wafer is placed between two adjacent ribs 26 and rests upon the support 30 which holds the silicon wafer in an elevated position with respect to the base 32 of the etch basket. The wafers are elevated to enable the etchant solution to completely contact the surfaces of the wafers as they are being etched. The side walls 18 and 20 also include openings 34 between the ribs 26 to further promote contact of the etchant solution with the wafers.

Figure 2:
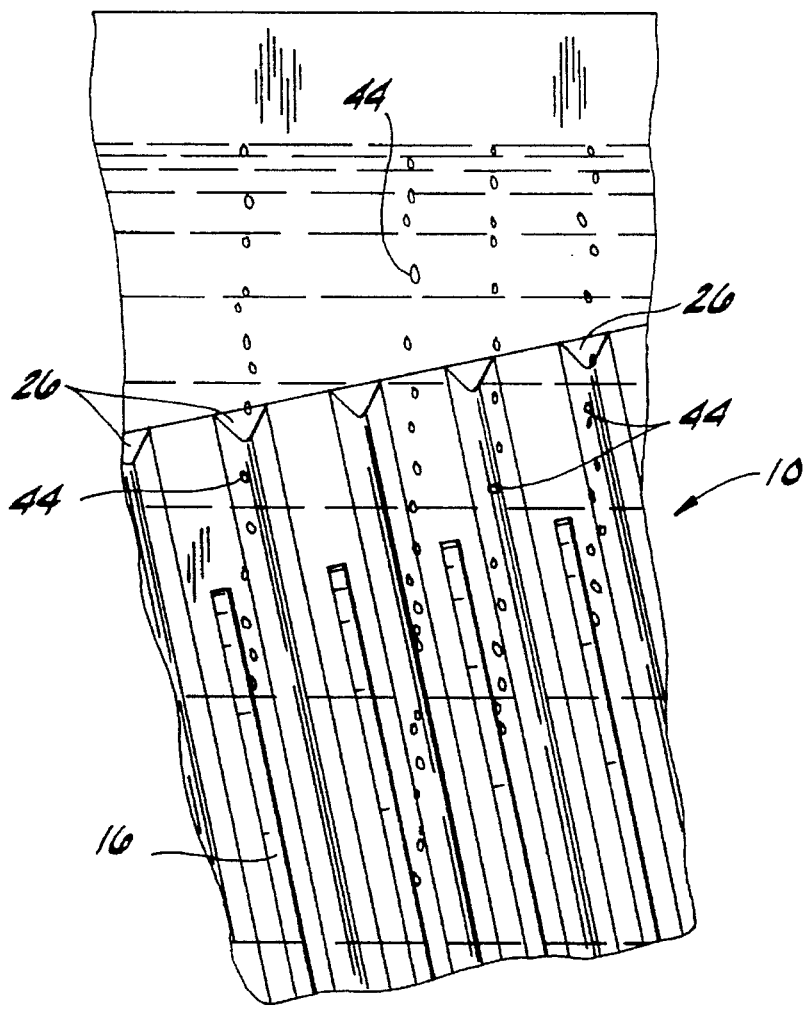
FIG. 2 is an enlarged view of the interior of the receptacle.

The compartment 14 is maintained in a canted position by a leg 36 extending from the back wall 24 (FIG. 4) of the compartment 14 beyond the base 32. When silicon wafers or other semiconductor articles are each placed within the compartment 14 between the ribs 26, the wafers are held in a canted position with their surfaces being parallel to each other as shown in FIG. 2. The front surface 38 of each of the wafers is then tilted upwardly toward the top of the etch tank. The length of the leg 36 can be varied depending upon the desired orientation of the front surface 38 of the wafers. For example, if the front surface 38 is to be positioned at 20° from a vertical orientation, the leg 36 will have a length which tilts the compartment by 20°. The wafers are preferably tilted from about 5° to about 35° from a vertical orientation.

In an alternative embodiment, the ribs along the side walls of the compartment are canted and parallel to each other in order to maintain the silicon wafers in a canted position. Although this arrangement would not require a leg in order to properly position the wafers, the position of the wafers could not be changed unless a leg or other extension was used to lengthen the front or back wall to change the angle at which the wafers are tilted.

Although a particular etch basket has been illustrated and described herein, any conventional receptacle for holding semiconductor material as it is etched, such as etch baskets which maintain the semiconductor surfaces in a vertical or horizontal orientation, can be adapted to form a receptacle of the present invention. These receptacles are adapted by adding a leg or other extension to lengthen the front or back wall of the compartment such that the wafers are canted once they are loaded into the compartment. Etch baskets which may be modified in accordance with the present invention are commercially available from manufacturers including Fluoroware.

The receptacle of the present invention is composed of a material which is chemically resistant to the etchant solution and which does not float when immersed in the etchant solution. Plastic resins, such as polyvinyl chloride, teflon, polypropylene and polyvinylidinedifluoride, are typically used in the industry. The receptacle is made using conventional methods for molding plastic objects.

The ribs 26 of the compartment 14 can be widely spaced to accommodate semiconductor materials of various shapes and thicknesses, such as slug samples or wafers. However, the ribs should be configured such that the etchant solution can contact the front surface 38 of the semiconductor material when the material is positioned between adjacent ribs of the etch basket. Although the samples or wafers can be placed within each slot formed by two adjacent ribs, the free flow of bubbles and etchant from their front surfaces can be assured by spacing the materials within the basket at adequate intervals. One inch spacings between adjacent samples or wafers is generally appropriate to promote such free flow. Additionally, the ribs should not obstruct a significant portion of the front surface at the edge of the semiconductor material because the defects on that portion may not be accurately detected if obstructed.

The semiconductor material is typically a whole, half or quarter polished silicon wafer or an ingot section or slug sample taken from a single crystal ingot for grown-in defect analysis. These materials must be free of contaminants and mechanical damage prior to being etched. Quarter and half wafers are placed with their rounded edge at the base of the etch basket. When so positioned, the apex of a quarter wafer or the cleave line of a half wafer is pointed upwardly.

The present invention is also directed to a method of etching a generally planar surface of a semiconductor material while the surface is tilted upwardly to reveal the flow pattern defect distribution on the wafer surface. The semiconductor material, such as silicon wafers, is placed within a receptacle such as the etch basket as described above in order to maintain the front surface of each wafer in a canted position such that the normal to the surface points upward rather than horizontally as with the conventional process.

The semiconductor material is canted during etching such that the surfaces of the wafer are from about 5° to about 35° from a vertical reference plane, and the front surface of the wafer faces upward. If the material is canted less than about 5°, the bubbles nucleated at flow pattern defects on the surface may travel upward along the surface rather than being released into the etchant solution as soon as they are formed. At angles greater than 35°, removal of semiconductor material from the wafer surface during etching is nonuniform in that a lesser amount of silicon is removed from the center of the wafer surface. Uniformity of silicon removal from the surface of a wafer is desirable because the depth of removal impacts the flow pattern density. An increase in the depth of silicon removal on a surface increases the flow pattern density on the surface. Flow pattern defects at different locations on a wafer surface can be accurately compared when silicon removal is uniform.

Once the wafers are loaded into the basket, the basket is immersed in an etchant solution 40 by placing the basket on the bottom of an etch tank 42 as shown in FIG. 1. As the chemical reaction occurs at the surface of a wafer, bubbles 44 nucleating at the flow pattern defects grow as reaction products are produced until the bubbles 44 are released upwardly into the etchant solution as illustrated in FIG. 2. The bubbles do not travel as far up the surface of the wafer when the wafer is canted as they do when the wafer is in a conventional vertical position. When a wafer front surface is canted, a greater number of flow patterns are developed at upper portions of the surface because fewer bubbles are dislodged from the surface before they develop flow patterns. Etching is also more uniform when bubbles are released into the etchant solution without first migrating along the wafer surface.

A Secco etchant solution is typically used to etch silicon wafers. These etchant solutions are generally composed of hydrofluoric acid and potassium dichromate and are commercially available. A suitable Secco etchant solution for use in the present invention includes from about 0.1 to about 10 parts by volume of an aqueous solution of about 1% to about 80% hydrofluoric acid to one part of an aqueous solution of about 0.01 to about 0.3 molar potassium dichromate. Preferably, the hydrofluoric acid solution contains from about 30% to about 60% hydrofluoric acid, and the potassium dichromate is from about 0.1 to about 0.2molar. A preferred Secco etchant, which is custom manufactured by Fisher Scientific, contains about two parts by volume of 49% hydrofluoric acid solution to one part of 0.15 molar potassium dichromate solution.

In formulating the Secco etchant, the potassium dichromate should be completely dissolved to avoid surface pitting and altered flow defect patterns. The Secco etchant should also be filtered to eliminate particle contamination problems. The ares of silicon etched, including the front and back of the wafer, should not exceed 350 $cm^2$ per liter of etch solution before the solution is replaced.

The semiconductor material is etched in the Secco etchant solution for about 30 seconds to about 4 hours, preferably from about 10 minutes to about 60 minutes. While the wafer surfaces are being etched, the etchant solution should not be agitated or subjected to any bubbling action other than that of the chemical reaction on the wafer surface. Other agitation may coat the wafer surfaces with bubbles preventing the etchant solution from contacting the wafer surface, or disturb the bubbles nucleated at the flow pattern defects on the wafer surface. These interferences generally result in non-uniform etching and undeveloped flow patterns.

After the etching process, the basket is removed from the etch tank and the material is rinsed with distilled water for about 10 seconds to about 24 hours, preferably for about 1 minute to about 15 minutes. The rinse can be an overflow rinse or can utilize bubbling, ultrasonics or mechanical or hand agitation to remove the etchant solution from the semiconductor material. The etched semiconductor material is then dried in air and the wafer front surfaces are analyzed.

Figure 5:
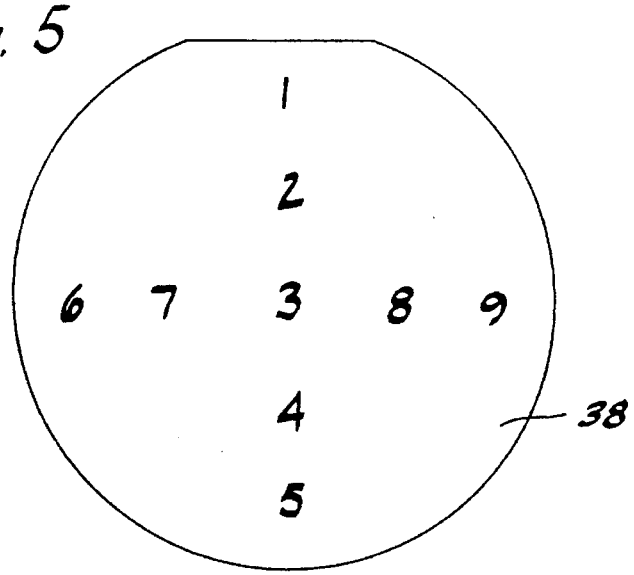
FIG. 5 illustrates typical flow pattern detection points on the front surface of a whole wafer.

When the wafer surface is analyzed under magnification, a well defined, V-shaped flow pattern indicates the position of a flow pattern defect. The number of defects on the surface are usually counted at several points on the wafer surface. The typical measurement points on a whole silicon wafer are shown in FIG. 5. This defect counting procedure is well known in the art. If the defect distribution is unacceptable, the crystal growth process is then modified so that subsequent crystals will contain fewer flow pattern defects.

The semiconductor materials are cleaned with conventional cleaning solutions prior to being etched. Any cleaning method which provides a clean, damage free, generally planar surface is suitable for purposes of the present invention. The wafer surface as commonly provided by wafer manufacturers after the polishing process is satisfactory and does not require further processing before being etched.

When slugs are used as the semiconductor article, they are first scrubbed with detergent, rinsed, and placed in a mixed acid etchant with agitation or bubbling applied to the tank before being transferred to a distilled water rinse. A representative mixed acid etchant includes hydrofluoric, acetic and nitric acids. Slugs or any other semiconductor materials are then cleaned with conventional cleaning solutions. A typical cleaning process entails dipping the semiconductor material in a hydrofluoric acid solution, rinsing the material, dipping it in a solution of ammonium hydroxide and hydrogen peroxide followed by rinsing, and dipping the material in a solution of hydrochloric acid and hydrogen peroxide and rinsing. The solutions are preferably agitated to prevent bubbles from coating the surface of the material and shielding it from contact with the cleaning solution. The semiconductor material is then stored in distilled water, or air dried and stored in a clean cassette without contaminating the front surface of the material. The material is etched within about twenty four hours of cleaning the material.

When silicon wafers, slugs or other semiconductor materials are placed within the etch basket, the flats, scribe marks or other identification marks must be applied at the top of the material. Bubbles originating at these markings during etching will not travel across other portions of the material and interfere with other bubbles if the markings are uppermost in the etch tank. For example, markings made along the cleave line of a half wafer or at the tip of a quarter wafer will prevent disturbances caused by the markings if these regions are at the top during etching.

The following examples are presented to describe preferred embodiments and utilities of the present invention and are not meant to limit the present invention unless otherwise stated in the claims appended hereto.

EXAMPLE 1

Twelve 150 mm silicon wafers from a single crystal ingot were polished and cleaned using the same polishing and cleaning processes. Six of the wafers were placed in an etch basket at a vertical orientation. Three of the wafers were placed in an etch basket which was canted by about 20° such that the polished surface of each wafer faced upwardly. The remaining three wafers were positioned in an etch basket of the invention such that the polished surfaces of the wafers tilted 20° downwardly from vertical. All of the wafers were etched for 30 minutes in a Secco etchant solution containing 11.7 liters of 49% by weight hydrofluoric acid, 264.6 grams granular potassium dichromate and 5.88 liters distilled water.

The flow pattern density was counted at nine points on each wafer surface using a microscope having a 50×magnification. The defect counting points are identified in FIG. 5, wherein point 1 is located at the top wafer edge beneath the flat of the wafer, and point 5 is located opposite point 1 at the bottom of the wafer surface. Point 3 is located at the center of the wafer surface. Points 2 and 4 are located midway between points 1 and 3 and points 3 and 5, respectively. Points 6 and 9 are located 1.5 cm from the respective left and right edges. Points 7 and 8 are located midway between points 6 and 3 and points 3 and 9, respectively. Accordingly, points 1 and 5, 2 and 4, 6 and 9, and 7 and 8 are located at equal radius. Flow pattern defect patterns were counted at 50×magnification if they were well defined, V-shaped patterns having two sides of an average length greater than 80 microns and a width of less than 50 microns at 20 microns up the pattern from its tip.

The average flow pattern densities for each set of wafers is summarized below in Table 1:

TABLE 1

| Location | Flow Pattern Defect Density (defects/cm$^2$) | | |
|---|---|---|---|
| | Vertical Orientation | Canted 20° Upward | Canted 20° Downward |
| Point 1 | 19 | 137 | 0 |
| Point 2 | 128 | 244 | 11 |
| Point 3 | 248 | 226 | 19 |
| Point 4 | 443 | 196 | 81 |
| Point 5 | 143 | 46 | 18 |
| Point 6 | 47 | 58 | 0 |
| Point 7 | 249 | 198 | 32 |
| Point 8 | 252 | 219 | 23 |
| Point 9 | 51 | 51 | 0 |

The variation within readings at equal radius is significantly lower for the upwardly canted wafers as compared to the vertically oriented wafers. The standard deviation for readings at equal radius for the points 2, 4, 7 and 8 is 22 for the upwardly tilted wafers, and 130 for the vertically oriented wafer. These results indicate that an improved quantitative measurement of the radial distribution of flow pattern defects is obtained by tilting the front surface of the wafer upwardly during etching. It is believed that upwardly tilting the front surface of the wafer prevents bubbles from being dislodged by other bubbles moving along the surface as on vertically oriented wafers. This allows the bubbles to leave a characteristic flow pattern. For example, the variation in defect density from 443 to 128 for respective points 4 and 2of the vertically oriented wafers indicates that many bubbles were dislodged before a flow pattern could be formed. However, the defect density at these points did not vary significantly for the upwardly canted wafers. These wafers had a defect density of 198 and 244 for respective points 4 and 2.

The vertically oriented and upwardly canted wafers have comparable average flow pattern densities which are much greater than the flow pattern density for the wafers tilted downward.

EXAMPLE 2

Twelve 150 mm silicon wafers from a single crystal ingot were polished and cleaned using the same polishing and cleaning processes. Four wafers were placed in an etch basket at a vertical orientation such that two wafers were in each slot with their back sides together. Only the polished front surfaces of the wafers were exposed so that the etchant would essentially only remove material from the front side of each wafer. The remaining eight wafers were also placed in an etch basket such that two wafers were back-to-back in each slot. The etch basket was canted by about 17° such that the polished front surface of four wafers faced upwardly and the polished front surface of four wafers faced downwardly. All of the wafers were etched for 30 minutes in the Secco etchant solution described in Example 1.

The thickness of silicon removed from the surface of the upward, downward and vertical surfaces were measured at the nine points shown in FIG. 5 and the total removal from each set of wafers was calculated. In comparing the removal at points of equal radius, the total removal at point 2 is greater than the total removal at point 4 by 24%, 49% and 41% for the upward, downward and vertical wafer surfaces, respectively. For the upwardly canted surface, the removal at points 7 and 8 is intermediate between the removal at points 2 and 4, indicating that the removal is independent of the etching angle. The upwardly canted surface shows the greatest uniformity of removal and therefore provides greater reproducibility among wafers from the same single crystal.

Assuming that the backside of each wafer was not etched because of the wafer placement during the etching process, the amount of silicon removed from an upward surface was calculated from the total removal at the upward and downward surfaces. The average removal for an upwardly canted surface is about 35% of the total removal from the wafer. In contrast, silicon removal is approximately equal for the vertically oriented surfaces of a wafer, indicating that about 15% more silicon is removed from a vertically oriented surface. Therefore, the average flow pattern density of a vertically oriented wafer is expected to be greater than that of an upwardly canted wafer because more etching occurs on a vertical surface. However in Example 1, the average flow pattern density for the vertically oriented and upwardly canted wafers were comparable. The average flow pattern density of the vertically oriented wafers is believed to be reduced by bubble interaction as described in Example 1.

The total removal and average flow pattern density for the upwardly canted wafers are shown in Table 2:

TABLE 2

| Location | Total Flow Pattern Defect Density (defects/cm$^2$) | Total Silicon Removal (microns) |
|---|---|---|
| Point 1 | 309 | 15.5 |
| Point 2 | 256 | 7.2 |
| Point 3 | 198 | 6.1 |
| Point 4 | 206 | 5.8 |
| Point 5 | 152 | 5.3 |
| Point 6 | 176 | 9.2[1] |
| Point 7 | 238 | 6.5 |
| Point 8 | 214 | 6.5 |
| Point 9 | 180 | 9.3[1] |

[1]Measured 1 cm from edge.

There is a positive correlation between total silicon removal and total flow pattern defects on the surface of an upwardly canted wafer. As shown in Table 2, the amount of silicon removed from a point corresponds to the defect density at that point. Downwardly canted wafers (as shown in Table 3 below) and vertically oriented wafers show a negative correlation. More silicon is removed from the upper half of the wafer surface and the least is removed from the lower half. The defect density, however, is lowest at the upper half and highest at the lower half.

TABLE 3

| Location | Total Flow Pattern Defect Density (defects/cm$^2$) | Total Silicon Removal (microns) |
|---|---|---|
| Point 1 | 309 | 25.5 |
| Point 2 | 33 | 17.4 |
| Point 3 | 75 | 14.3 |
| Point 4 | 154 | 11.7 |
| Point 5 | 213 | 8.4 |
| Point 6 | 55[1] | 11.7[1] |
| Point 7 | 80 | 13.6 |
| Point 8 | 84 | 13.4 |
| Point 9 | 47[1] | 11.7[1] |

[1]Measured 1 cm from edge.

EXAMPLE 3

Eleven 150 mm silicon wafers from a single crystal ingot were polished and cleaned using the same polishing and cleaning processes. Six of the wafers were placed in an etch basket at a vertical orientation. Five of the wafers were placed in an etch basket of the present invention which was canted by about 17° such that the polished front surface of each wafer faced upwardly. All of the wafers were etched for 30 minutes in the Secco etchant solution described in Example 1. The flow pattern densities were measured at the nine points shown in FIG. 5. The average flow pattern density for the vertical and upwardly canted wafers was about 214 defects/cm$^2$ and about 252 defects/cm$^2$, respectively. As suggested in Examples 1 and 2, the greater flow pattern density for the upwardly canted wafers likely results from the elimination of bubble interactions on the wafer surface.

The fractional standard deviation for points of equal radius (calculated as the standard deviation of 4points at equal radius divided by the average of the 4points) is lower for the upwardly canted wafers, indicating better reproducibility of measurements for wafers from a single crystal. The fractional standard deviation for upward and vertical wafer surfaces, respectively, is 14% and 19% for the midpoints 2, 4, 7 and 8, and 17% and 26% for points 1, 5, 6 and 9 along the wafer edge.

We claim:

1. A method of etching a generally planar surface of a semiconductor material to reveal defects on the surface, the method comprising:

placing the material in a canted position, ranging from about 5° to about 35° from vertical, such that the generally planar surface of the material faces upwardly;

immersing the material so positioned into a stagnant etchant solution; and etching the surface of the material such that bubbles nucleating at defects on the surface of the canted material are released directly into the otherwise stagnant etchant solution.

2. The method of claim 1 wherein the etching is substantially uniform across the surface of the canted material.

3. The method of claim 1 wherein the semiconductor material is a silicon wafer and the surface is polished and cleaned before being immersed in the etchant solution.

4. A method of determining the distribution of defects on a generally planar surface of a semiconductor material, the method comprising:

placing the material in a canted position, ranging from about 5° to about 35° from vertical, such that the generally planar surface of the material faces upwardly;

immersing the material so positioned into a stagnant etchant solution;

etching the surface of the material such that bubbles nucleating at defects on the surface of the canted material are released directly into the otherwise stagnant etchant solution;

removing the material from the etchant solution; and measuring the defects on the surface of the material.

5. The method of claim 4 wherein the bubbles do not drift along the surface of the material prior to being released into the etchant solution.

6. The method of claim 4 wherein the semiconductor material is a silicon wafer and the surface is polished and cleaned before being immersed in the etchant solution.

* * * * *